United States Patent
Razeghi

(10) Patent No.: US 6,570,179 B1
(45) Date of Patent: May 27, 2003

(54) III-V SEMICONDUCTORS SEPARATE CONFINEMENT SUPERLATTICE OPTOELECTRONIC DEVICES

(75) Inventor: Manijeh Razeghi, Wilmette, IL (US)

(73) Assignee: MP Technologies, LLC, Wilmette, IL (US)

( * ) Notice: Subject to any disclaimer, the term of this patent is extended or adjusted under 35 U.S.C. 154(b) by 0 days.

(21) Appl. No.: 09/548,731

(22) Filed: Apr. 13, 2000

Related U.S. Application Data

(60) Provisional application No. 60/071,427, filed on Jan. 14, 1998.

(51) Int. Cl.[7] .................... H01L 29/06; H01L 21/00; H01S 5/34
(52) U.S. Cl. .................... 257/15; 372/45; 438/29
(58) Field of Search .................... 372/45; 257/15; 438/29

(56) References Cited

U.S. PATENT DOCUMENTS

| | | | |
|---|---|---|---|
| 4,675,708 A | 6/1987 | Onabe | 357/4 |
| 5,075,743 A | 12/1991 | Behfar-Rad | 357/17 |
| 5,384,151 A * | 1/1995 | Razeghi | 427/58 |
| 6,198,112 B1 * | 3/2001 | Ishida et al. | 257/15 |

* cited by examiner

*Primary Examiner*—James Davie
(74) *Attorney, Agent, or Firm*—Welsh & Katz, Ltd.

(57) ABSTRACT

A method for making of an optoelectronic device and the device therefor comprising confinement layers, waveguides and active layers, all of which comprise a superlattice of binary III–V compounds.

31 Claims, 2 Drawing Sheets

III-V SEMICONDUCTORS SEPARATE CONFINEMENT SUPERLATTICE OPTOELECTRONIC DEVICES

This application claim benefit to provisional application No. 60/071,427 Jan. 14, 1998.

FIELD OF THE INVENTION

This invention relates to a method for the making of optoelectronic semiconductor devices and more specifically to the making of separate confined superlattice structures prepared from binary III–V compounds.

BACKGROUND OF THE INVENTION

The growth of semiconductor III–V compounds by chemical vapor deposition (CVD) using organometallics and hydrides as elemental sources has developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

In general, III–V semiconductor alloys in the form of binary, ternary, and quaternary compounds are used when forming semiconductor multi-layer devices. A prime concern is the lattice matching of all adjacent layers. Useful physical properties derive directly from adjacent layers which are properly lattice matched. Lattice constants of these alloys can be determined mathematically. For instance see FIG. 2 of U.S. Pat. No. 5,384,151. For ternary compounds $A_xB_{1-x}C$ the bandgap energy $Eg(x)$ varies with the composition X as follows:

$$Eg(x) = Eg(0) + bx + cx^2 \qquad (1)$$

where $Eg(0)$ is the bandgap energy of the lower bandgap binary compound, c is the bowing parameter, b is the fitting parameter and $x \leq 1$. Representative ternary compound bandgaps are as follows. Representative values for b are shown.

| Ternary | Direct energy gap $E_g$ (eV) |
|---|---|
| $Al_xGa_{1-x}As$ | $E_g(x) = 1.424 + 1.247x$ |
| $Al_xIn_{1-x}As$ | $E_g(x) = 0.360 + 2.012x + 0.698x^2$ |
| $Al_xGa_{1-x}Sb$ | $E_g(x) = 0.726 + 1.139x + 0.368x^2$ |
| $Al_xGa_{1-x}Sb$ | $E_g(x) = 0.172 + 1.621x + 0.43x^2$ |
| $Ga_xIn_{1-x}P$ | $E_g(x) = 1.351 + 0.643x + 0.786x^2$ |
| $Ga_xIn_{1-x}As$ | $E_g(x) = 0.360 + 1.064x$ |
| $Ga_xIn_{1-x}Sb$ | $E_g(x) = 0.172 + 0.139x + 0.415x^2$ |
| $GaP_xAs_{1-x}$ | $E_g(x) = 1.424 + 1.15x + 0.176x^2$ |
| $GaAs_xSb_{1-x}$ | $E_g(x) = 0.726 + 0.502x + 1.2x^2$ |
| $InP_xAs_{1-x}$ | $E_g(x) = 0.36 + 0.891x + 0.101x^2$ |
| $InAs_xSb_{1-x}$ | $E_g(x) = 0.18 + 0.41x + 0.58x^2$ |

$In_xGa_{1-x}N \; Eg(x) =$

The lattice constant of ternary alloys can be expressed as $$a_{alloy} = xa_A + (1-x)a_B \qquad (3)$$

where $a_A$ and $a_B$ are the lattice constants of the binary alloys A+B, and $x \leq 1$.
For quaternary compounds, the lattice parameter $a_0$ of an alloy $A_xB_{1-x}C_yD_{1-y}$ is:

$$a_0 = xya_{AC} + x(1-y)a_{AD} + (1-x)ya_{BC} + (1-x)(1-y)a_{BD} \qquad (4)$$

where $x, y \leq 1$.
The bandgap energy of a quaternary compound is:

$$Eg = xy\,E_{AC} + x(1-y)E_{AD} + (1-x)E_{BC} + (1-x)(1-y)E_{BD} \qquad (5)$$

where $x, y \leq 1$.
The following table shows binary compounds which may be matched to quaternary compounds:

| Quaternary | Lattice-matched binary | Wavelength, $\lambda$ ($\mu$m) |
|---|---|---|
| $Al_xGa_{1-x}P_yAs_{1-y}$ | GaAs | 0.8–0.9 |
| $Al_xGa_{1-x}As_ySb_{1-y}$ | InP | 1 |
| $Al_xGa_{1-x}As_ySb_{1-y}$ | InAs | 3 |
| $Al_xGa_{1-x}As_ySb_{1-y}$ | GaSb | 1.7 |
| $Ga_xIn_{1-x}P_yAs_{1-y}$ | GaAs, InP | 1–1.7 |
| $Ga_xIn_{1-x}P_ySb_{1-y}$ | InP, GaSb, AlSb | 2 |
| $In(P_xAs_{1-x})_ySb_{1-y}$ | AlSb, GaSb, InAs | 2–4 |
| $In(Ga_xAl_{1-x})_yN_{1-y}$ | GaN, InN, AlN | 0.2–0.6 |
| $(Al_xGa_{1-x})_yIn_{1-y}P$ | GaAs, $Al_xGa_{1-x}As$ | 0.57 |
| $(Al_xGa_{1-x})_yIn_{1-y}As$ | InP | 0.8–1.5 |
| $(Al_xGa_{1-x})_yIn_{1-y}Sb$ | AlSb | 1.1–2.1 |

Based on the above, it can be seen that when one is preparing a semiconductor device with quaternary compounds and ternary compounds, the selection of materials becomes all important and limiting to the selection process, particularly when lattice matching is taken into account.

An object, therefore of the subject invention is the growth of high quality semiconductor devices with wavelength ranges from 0.26 to 10 microns.

A further object of the subject invention is a semiconductor utilizing superlattice structures for confinement layers, active layers, and waveguide layers.

A further object of the subject invention is a semiconductor structure formed solely of binary alloy compounds in a superlattice environment.

These and other objects are obtained by the subject invention wherein there is provided a semiconductor device and a method for making such semiconductor device comprising confinement layers, waveguide layers, and active layer, all of which or partially of which are formed of a superlattice structure of binary III–V compounds. Depending on the selection of III–V compounds, lasers which emit at wavelengths of from 0.2 microns to 10 microns may be prepared.

CONCISE DESCRIPTION OF THE DRAWING

DETAILED DESCRIPTION OF THE INVENTION

Figure 1:
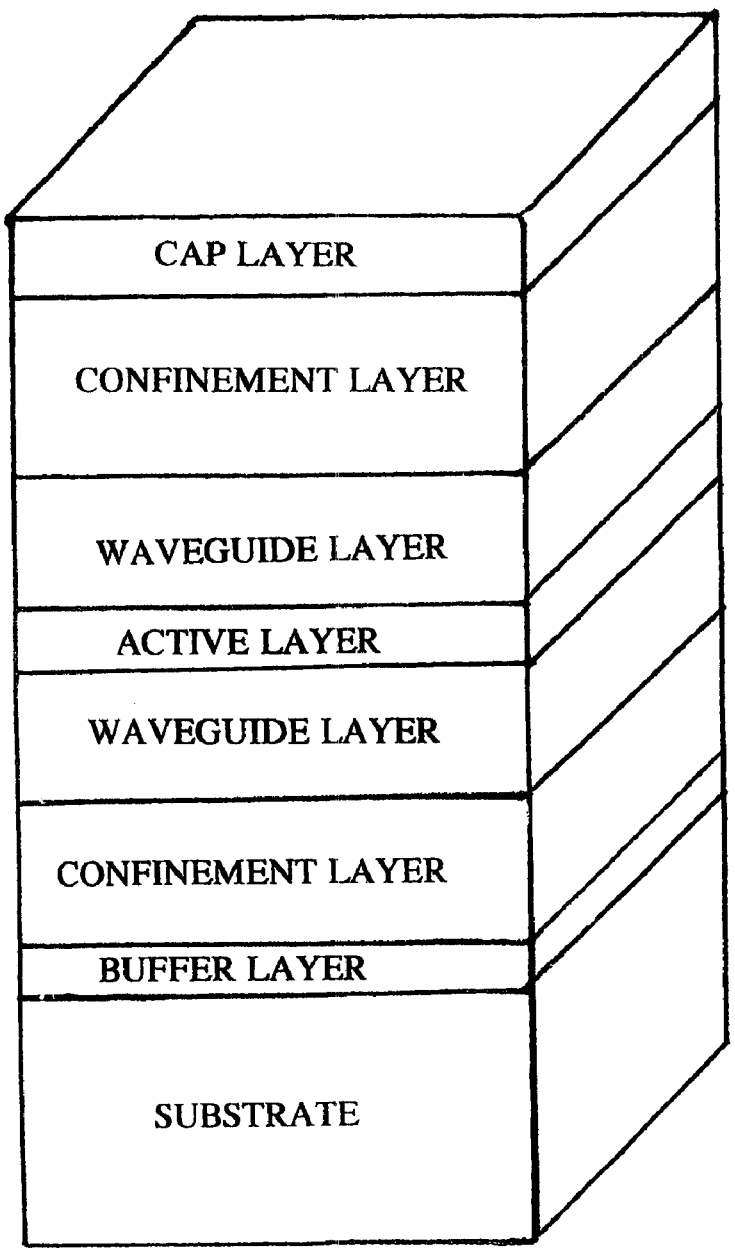
FIG. 1 is a schematic diagram of a semiconductor device of the subject invention.

The reactor and associated gas-distribution scheme used herein are substantially as described in U.S. Pat. No. 5,384,151. The system comprises a cooled quartz reaction tube pumped by a high-capacity roughing pump (120 hr$^{-1}$) to a vacuum between 7 and 760 Torr. The substrate was mounted on a pyrolytically coated graphite susceptor that was heated by rf-induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters min$^{-1}$, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The gas sources used in this study for the growth of III–V compounds by LP-MOCVD are listed below:

| Group-III Sources | Group-V Source |
|---|---|
| $In(CH_3)_3$ | t-butylamine |
| $In(C_2H_5)_3$ | $NH_3$ |
| $(CH_3)_2In(C_2H_5)$ | As $(CH_3)_3$ |
| $(CH_3)_2In(C_2H_5)$ | As $(C_2H_5)_3$ |
| $Ga(CH_3)_3$ | $AsH_3$ |
| $Ga(C_2H_5)_3$ | $PH_3$ |
| $(CH_3)_3Al$ | |

An accurately metered flow of purified $H_2$ for TMIn and TEGa is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure Arsine ($AsH_3$) and Phosphine ($PH_3$) are used as a source of As and P. The metal alkyl or hydride flow can be either injected into the reactor or into the waste line by using two-way valves. In each case, the source flow is first switched into the waste line to establish the flow rate and then switched into the reactor. The total gas flow rate is about 8 liters min$^{-1}$ during growth. Stable flows are achieved by the use of mass flow controllers.

Dopants usable in the method of the subject invention are as follows:

| n dopant | p dopant |
|---|---|
| $H_2Se$ | $(CH_3)_2Zn$ |
| $H_2S$ | $(C_2H_5)_2\ Zn$ |
| $(CH_3)_3Sn$ | $(C_2H_5)_2\ Be$ |
| $(C_2H_5)_3Sn$ | $(CH_3)_2Cd$ |
| $SiH_4$ | $(\eta C_2H_5)_2Mg$ |
| $Si_2H_6$ | |
| $GeH_4$ | |

The epitaxial layer quality is sensitive to the pretreatment of the substrate and the alloy composition. Pretreatment of the substrates prior to epitaxial growth was thus found to be beneficial. One such pretreatment procedure is as follows:
1. Dipping in $H_2SO_4$ for 3 minutes with ultrasonic agitation;
2. Rinsing in Deionized $H_2O$;
3. Rinsing in hot methanol;
4. Dipping in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.
After this treatment, it is possible to preserve the substrate for one or two weeks without repeating this treatment prior to growth.

A buffer layer is always grown on the substrate in the subject invention. The buffer layer is a material with a lattice parameter as near as possible to that of the substrate, and the bottom confinement layer is lattice matched to the buffer layer. A cap layer is also present.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 450° C. and 650° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

As stated, high quality III–V materials of the subject invention may be grown by low pressure metalorganic chemical vapor deposition (LP-MOCVD). Other forms of deposition of III–V films for use in the subject invention, may be used as well, including MBE (molecular beam epitaxy), MOMBE (metalorganic molecular beam epitaxy), LPE (liquid phase epitaxy and VPE (vapor phase epitaxy).

Due to the difficulty of lattice matching quaternary III–V compounds in a heterostructure, the subject invention prepares the heterostructure with binary compounds in a superlattice structure in the confinement, active, and waveguide layers. By preparing the superlattice structure with binary compounds, the energy gap may be tailored through the use of equations 1 and 3–5 to that desired by controlling the thickness of the superlattice, For purposes of determining Eg and the lattice constant superlattice of two binary compound is treated as a ternary compound, and Equations 1 and 3 are used There are minimal or no lattice matching problems as the binary compounds easily lattice match to one another. Also, the multiple interfaces of the superlattice can bend the propagation of the dislocations outward, and hence reduce the density of dislocations effectively. The selection of the materials used will control the wavelength which is emitted from the resulting device. The thickness of the superlattice structure can be calculated from the value of the energy gap necessary in the heterostructure.

The superlattices in the n-doped confinement layer are designed to facilitate the transport of the electrons through the minibands and block the transport to the electrons throughout the minibands and block the transport of the holes by its minigap. The superlattices in the p-doped confinement layer are designed to facilitate the transport of the holes through the minibands and block the transport of electrons by its minigap. Reflection and transmission amplitude may be calculated as follows:

The superlattice can be treated as a series of barriers.

To calculate the reflectivity of an electron through the superlattice, we can solve the Schroedinger equation to obtain the wave function $\psi$ of an electron:

$$-\frac{\hbar^2}{2}\frac{d}{dx}\left(\frac{1}{m}\frac{d\psi}{dx}\right) + V(x)\psi = E\psi \quad (9)$$

where m* is the effective mass, V(x) is the potential energy, and E is the total energy of an electron. The solution to equation (9) is a plane wave. For an n-period superlattice, the wave function of the first, last, and p$^{th}$ cavity is expressed by:

$$\psi_1 = \exp(ik_rx) + Re\ xp(ik_rx) \quad (10)$$

$$\psi_1 = T \exp(ik_rx) \quad (11)$$

$$\psi_p = A_p \exp(ik_px) + B_p \exp(ik_px) \quad (12)$$

where $A_p$ and $B_p$ are the amplitudes of the incident and the reflected waves, respectively, R and T are the reflection and transmission amplitudes.

By matching at each interface the wave functions and their first derivatives divided by the effective mass according to effective mass theory, we arrive at $$\left(\frac{T}{o}\right) = M_1 \ldots M_p \ldots M_n \left(\frac{1}{R}\right) \quad (13)$$

where $$M_p = \frac{1}{4} \left( \frac{\exp(ik_{p+2}d_{p+2}) \cdot \exp(ik_{p+2}d_{p+2})}{\exp(-ik_{p+2}d_{p+2}) \cdot -\exp(-ik_{p+2}d_{p+2})} \right) \cdot$$
$$\left( \frac{\exp(ik_{p+1}d_{p+1}) \cdot \exp(-ik_{p+1}d_{p+1})}{-i(k_{p+1}/k_{p+2}) \cdot \exp(ik_{p+1}d_{p+1}) \cdot -i(k_{p+1}/k_{p+2}) \cdot \exp(ik_{p+1}d_{p+1})} \right) \cdot$$
$$\left( \frac{1 + i(k_p/k_{p+1}) \cdot (1 - i(k_p/k_{p+1}))}{1 - i(k_p/k_{p+1}) \cdot (1 + i(k_p/k_{p+1}))} \right) \quad (14)$$

in which $k_p = [2m^*(V-E)]^{1/2}/h$. (15)

The reflection and transmission amplitudes are given by:

$$R = M_{21}/M_{22} \quad (16)$$

$$\text{and } T = M_{11} - M_{12}M_{21}/M_{22} \quad (17)$$

Figure 2:
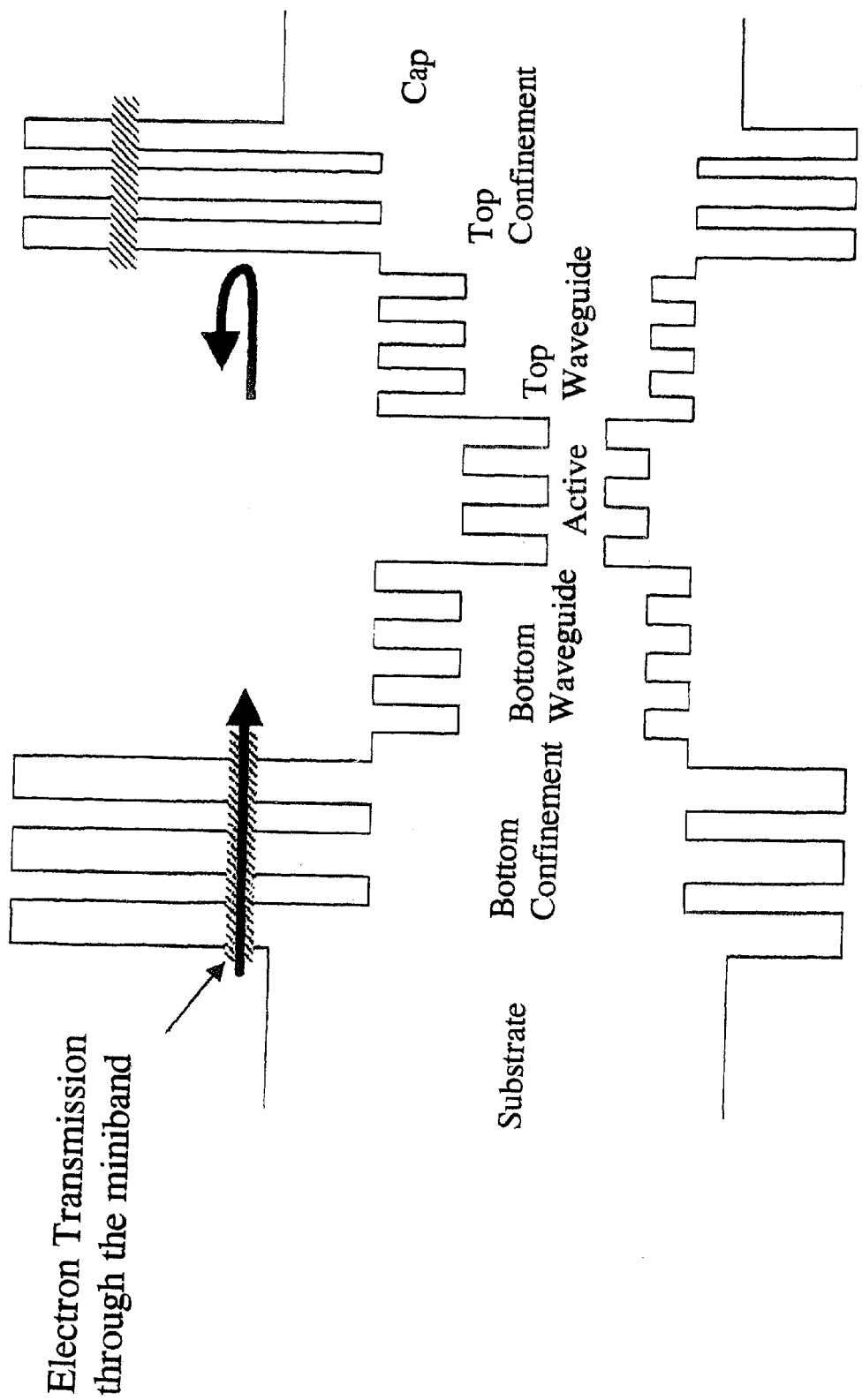
FIG. 2 is a energy gap of a semiconductor device of the subject invention.

As an example, FIG. 2 shows the transmission of GaAs/AlAs superlattice. The well and barrier thicknesses are 200 Å and 500 Å, respectively. It is clear that at electron energy of E=~0.1 $\Delta E_0$ the superlattice has many times higher transmission than the other energies.

Thus, the following examples show use of different materials to provide lasers emitting at different wavelengths. The following examples are prepared by MBE according to the schematic structure shown in FIG. 1: growing a buffer layer, then a bottom confinement layer on a substrate, then growing a bottom waveguide layer on the confinement layer, an active layer on the lower waveguide layer, then a top waveguide layer. A top confinement layer is grown on the top waveguide layer with a contact layer on the upper confinement. Each of the waveguide layers, active layers and confinement layers are superlattice structures, i.e., a plurality of layers, each layer 5 Å to 50 Å. Each of the bottom confinement and bottom waveguide layers are doped with an n-type dopant such as Se, S, Sn, Si, or Ge. Each of the top waveguide and top confinement layers are doped with p-type dopants such as Zn, Be, Cd, or Mg. The active layer is not doped. The energy gap (Eg) of each layer must be in the following order:

$E_g$ confinement layer > $E_g$ waveguide layer > $E_g$ active layer, as shown in FIG. 2.

More than two binary compounds may comprise the superlattice structure, for instance; in a device having bottom and top confinement superlattice layers of GaP/InP with bottom and top waveguide superlattice layers of GaAs/InP on a GaAs substrate, the active layer could be a superlattice of layers of $(InAs)_n(GaAs)_m(InP)_p(GaP)_q)_r(n, m, p, q>1)$ ($5 \leq R \leq 150$).

EXAMPLE 1

| | |
|---|---|
| Wavelength | 0.6–2.0 μm: |
| Substrate | InP or GaAs |
| Buffer layer | GaAs; or other suitably matched III–IV compound |
| Bottom and top confinement layers | superlattice $[(GaP)_n - (InP)_m]_p$ with n > 1, m > 1, p > 100 |
| Bottom and top waveguide layers | superlattice $[(GaP)_n, (InP)_m, (GaAs)_p, (InAs)_a]c$ with n > 1, m > 1, p > 1, q > 1, c > 100 |
| Active layer | superlattice $[(InAs)_n - (GaAs)_m]_p$ |
| Cap layer | InAs |

The buffer layer is selected to lattice match with the substrate. The values of x, y and z may be calculated by matching the $E_g$ of the various layers with each other, starting with the buffer layer. Thus, the confinement layer $E_g$ is matched with the buffer layer utilizing equations 3–5 as appropriate. The waveguide layer $E_g$ is matched to the confinement layer, and so on.

EXAMPLE 2

| | |
|---|---|
| Wavelength | 2–10 μm |
| Substrate | Si or GaAs or SiC, or InAs, or InSb, GaSb, InP |
| Bottom and top confinement layer | x layers InP x layers GaP/x layers InSb/x layers GaSb superlattice |
| Bottom and top waveguide layer | y layers InAs/y layers InSb superlattice |
| Active layer | z layers InAs/z layers InSb superlattice |
| Cap layer | InAs |

Lower confinement and lower waveguide layers are doped with Si.

Upper waveguide and upper confinement layers are doped with Zn.

x, y, and z are determined as in Example 1.

EXAMPLE 3

| | |
|---|---|
| Wavelength | 0.2–0.6 μm |
| Substrate | SiC, Al$_2$O$_3$, Si, GaAs, MgO, or ZnO |
| Buffer layer | GaN or other binary III-IV compound lattice matched to substrate |
| Bottom and top confinement layer | x layers AlN/x layers GaN superlattice |
| Bottom and top waveguide layer | y layers GaN/y layers InN superlattice |

-continued

| | |
|---|---|
| Active layer | z layers GaN/z layers InN superlattice |
| Cap layer | GaN or InN superlattice |

Lower confinement and lower waveguide layers are doped with Si, Ge, S, or codoping. Upper waveguide and upper confinement layers are doped with Zn, Mg, Be, or codoping. The length of the period in the superlattice is determined through the use of Equations 3–5, as in Example 1.

EXAMPLE 5

| | |
|---|---|
| Wavelength | 0.6–1 μm |
| Substrate | InP |
| Buffer layer | GaAs |
| Bottom and top confinement layer | x layers GaP/x layers InP superlattice |
| Bottom and top waveguide layer | y layers GaP/y layers/y layers GaAs/y layers InAs superlattice |
| Active layer | z layers InAs/z layers GaAs superlattice |
| Cap layer | GaN |

Lower confinement and lower waveguide layers are doped with Si. Upper waveguide and upper confinement layers are doped with Zn. The length of the period in the superlattice is determined through the use of Equations 3–5, as in Example 1.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

I claim:

1. A semiconductor device comprising a substrate, a first confinement layer, a first waveguide layer, an active layer, a second confinement layer and a second waveguide layer, each of said layers formed solely of binary III–V compounds, each of said first and second waveguide layers and said active layer being a super lattice structure with at least two alternating III–V compounds.

2. The device of claim 1, wherein said first waveguide layer is doped with a n-type dopant.

3. The device of claim 1, wherein said second waveguide layer is doped with a p-type dopant.

4. The device of claim 2, wherein said first waveguide layer is doped with a dopant selected from the group of Se, S, Sn, Si, and Ge.

5. The device of claim 3, wherein said second waveguide layer is doped with a dopant selected from the group of Zn, Be, Cd, and Mg.

6. The device of claim 1, wherein said active layer is not doped.

7. The device of claim 1, wherein each superlattice is from 5–150 layers.

8. The device of claim 1, wherein said first confinement layer is doped with a n-type dopant.

9. The device of claim 1, wherein said second confinement layer is doped with a p-type dopant.

10. The device of claim 8, wherein said first confinement layer is doped with a dopant selected from the group of Se, S, Sn, Si, and Ge.

11. The device of claim 9, wherein said second confinement layer is doped with a dopant selected from the group of Zn, Be, Cd, and Mg.

12. The device of claim 1, wherein each layer of a superlattice structure is from about 5 Å to about 5 Å.

13. The device of claim 1, wherein the energy gap of said first and second confinement layers is larger than the energy gap of said first and second wave guide layers which is larger than the energygap of said active layer.

14. The device of claim 1, wherein each superlattice structure has the formula $A_xB_{1-x}C_yD_{1-y}$ and the lattice parameter of said first and second confinement layer, said first and second waveguide layer and said active layer are matched through the use of the formula is $$a_0 = xya_{AC} + x(1-y)a_{AD} + (1-x)ya_{BC} + (1-x)(1-y)a_{BD} \text{ where } x, y \leq 1.$$

15. A method of preparing a semiconductor device comprising growing, in sequence a substrate, a first confinement layer, a first waveguide layer, an active layer, a second confinement layer and a second waveguide layer, and growing each of said waveguide and active layers solely of binary III–V compounds and in a superlattice structure.

16. The method of claim 15, including doping said first waveguide layer with a n-type dopant.

17. The method of claim 15, including growing said second waveguide layer with a p-type dopant.

18. The method of claim 17, including doping said first waveguide layer with a dopant selected from the group of Se, S, Sn, Si, and Ge.

19. The method of claim 18, including doping said second waveguide layer with a dopant selected from the group of Zn, Be, Cd, and Mg.

20. The method of claim 15, including growing each superlattice structure from 5–150 layers.

21. The method of claim 15, including doping said first confinement layer with a n-type dopant.

22. The method of claim 15, including doping said first confinement layer with a p-type dopant.

23. The method of claim 22, including doping said first confinement layer with a dopant selected from the group of Se, S, Sn, Si, and Ge.

24. The method of claim 19, including doping said second confinement layer with a dopant selected from the group of Zn, Be, Cd, and Mg.

25. The method of claim 15, including the step of growing each layer of a superstructure to a thickness of about 5 Å to about 50 Å.

26. The method of claim 15, wherein the energy gap of said first and second confinement layers is larger than the energy gap of said first and second wave guide layers which is larger than the energy gap of said active layers.

27. A semiconductor device comprising a substrate, a first confinement layer, a first waveguide layer, an active layer, a second confinement layer and a second waveguide layer, each of said layers formed solely of binary III–V compounds of the formula $A_xB_{1-x}C_yD_{1-y} (x, y \leq 1)$, a lattice parameter of each of said first and second confinement layer, said first and second waveguide layer and said active layer being matched through the use of the formula $a_0 = xya_{AC} + x(1-y)a_{AD} + (1-x)ya_{AC} + (1-x)(1-y)a_{BD}$.

28. The device of claim 27, wherein the energy gap of said first and second confinement layers is larger than the energy gap of said first and second wave guide layers which is larger than the energygap of said active layer.

29. A semiconductor device comprising a substrate, a first confinement layer, a first waveguide layer, an active layer, a second confinement layer and a second waveguide layer, each of said layers formed solely of binary III–V compounds of the formula $A_xB_{1-x}C_yD_{1-y}$ (x, y≦1), the energy gap of said first and second confinement layer, said first and second waveguide layer and said active layer being matched through the use of the formula $$E_g = xyE_{AC} + x(1-y)E_{AD} + (1-x)yE_{BC} + (1-x)(1-y)E_{BD}.$$

30. The device of claim 29, wherein the lattice parameter of said first and second confinement layer, said first and second waveguide layer and said active layer are matched through the use of the formula $a_0 = xya_{AC} + x(1-y)a_{AD} + (1-x)ya_{BC} + (1-x)(1-y)a_{BD}$ where x, y≦1.

31. The device of claim 29, wherein each superlattice structure has the formula $A_xB_{1-x}C_yD_{1-y}$(x, y≦1) and the energy gap ($E_g$) of said first and second confinement layer, said first and second waveguide layer and said active layer is matched through the use of the formula $E_g = xyE_{AC} + x(1-y)E_{AD} + (1-x)yE_{BC} + (1-x)(1-y)E_{BD}$.

* * * * *